United States Patent [19]
Yoshida et al.

[11] Patent Number: 5,049,751
[45] Date of Patent: Sep. 17, 1991

[54] INFRARED RAYS DETECTING APPARATUS

[75] Inventors: Yukihiro Yoshida, Yokohama; Hirokazu Fukuda, Kakogawa; Hiroyuki Tsuchida, Kawasaki; Shigeki Hamashima; Koji Hirota, both of Yokohama, all of Japan

[73] Assignee: Fujitsu Limited, Kawasaki, Japan

[21] Appl. No.: 622,584

[22] Filed: Dec. 5, 1990

[30] Foreign Application Priority Data

Dec. 6, 1989 [JP] Japan .................. 1-315200

[51] Int. Cl.⁵ .................. G01J 5/30; G01J 5/04
[52] U.S. Cl. .................. 250/352; 250/338.1
[58] Field of Search .................. 250/352, 338.1; 62/51.1; 357/30 Q, 30 R, 68, 68 M, 83

[56] References Cited

U.S. PATENT DOCUMENTS

| 4,059,764 | 11/1977 | Belaso et al. | 250/352 |
| 4,487,037 | 12/1984 | Meignin et al. | 62/51.1 |
| 4,491,729 | 1/1985 | Stahl et al. | 250/336.1 |
| 4,565,925 | 1/1986 | Anderson et al. | 250/352 |
| 4,755,676 | 7/1988 | Gaalema et al. | 250/352 |

FOREIGN PATENT DOCUMENTS

| 53-072486 | 6/1978 | Japan | 250/349 |
| 58-169035 | 10/1983 | Japan | 250/338.1 |
| 60-155928 | 8/1985 | Japan | 250/352 |
| 60-179618 | 9/1985 | Japan | 250/352 |
| 61-155925 | 7/1986 | Japan | 250/352 |

Primary Examiner—Constantine Hannaher
Assistant Examiner—Jacob M. Eisenberg
Attorney, Agent, or Firm—Armstrong, Nikaido, Marmelstein, Kubovcik & Murray

[57] ABSTRACT

An infrared rays detecting apparatus is disclosed wherein the area of a loop provided by an element line and a grounding line formed on an inner tube is minimized to reduce an induced electromotive force to minimize production of noises so that correct detection can be accomplished. A grounding line is interposed for each arbitrary number of element lines on a surface of the inner tube, and the element lines are individually connected to output electrodes of an infrared rays sensor of the multi-element type while the individual grounding lines are connected to a common grounding electrode of the infrared rays sensor.

8 Claims, 5 Drawing Sheets

INFRARED RAYS DETECTING APPARATUS

BACKGROUND OF THE INVENTION

This invention relates to an infrared rays detecting apparatus having a tube on which an infrared rays sensor of the multi-element type is carried.

Infrared rays sensors are employed in many fields, for example, for meteorological observation by means of an artificial satellite, prevention of crimes, accident prevention, geological and/or resource survey, and medical treatment by infrared rays thermography since they can detect presence, shapes, temperatures, compositions and so forth of target bodies without contacting with the bodies. Among such infrared rays sensors, sensors of the photoelectric conversion type which employ a binary or ternary compound semiconductor are high in sensitivity and also in responding speed, but it is normally necessary to cool an element substantially to the temperature of liquid nitrogen.

To this end, an infrared rays detecting apparatus which incorporates therein such an infrared rays sensor as described above normally has the following construction. In particular, an infrared rays transmitting window is provided at a portion of a vacuum insulated vessel of the dual structure including an inner tube and an outer tube, and an infrared rays sensor composed of a plurality of elements is disposed at a top portion of the inner tube in an opposing relationship to the infrared rays transmitting window. Either such coolant as liquid nitrogen is contained in the inner tube of the insulated vessel or a low temperature cooling apparatus of the Joule-Thomson type or the like is installed to cool the infrared rays sensor substantially to the temperature of liquid nitrogen during operation of the infrared rays sensor.

In order to extract a signal from such infrared rays sensor, the following construction is employed. In particular, gold is vapor deposited on a surface of the inner tube to which the infrared rays sensor is adhered to form a deposited gold film, and the deposited gold film is cut to form a grounding line and element lines, which are individually connected by way of bonding wires to a common ground electrode terminal and a plurality of output electrodes of the infrared rays sensor. Further, the element lines and grounding line are connected by way of bonding wires to a plurality of gold patterns formed on an annular ceramic substrate disposed around the inner tube so as to extract signals from the gold patterns.

In such an infrared rays detecting apparatus as described above, a loop is formed by an element line and the grounding line formed on the inner tube. However, where the loop has a comparatively great area, if, for example, the infrared rays detecting apparatus is vibrated or an external magnetic field is fluctuated, an electromotive force produced in the loop will make a noise source and correct signals cannot be extracted from the infrared rays detecting apparatus. Accordingly, an infrared rays detecting apparatus is demanded which minimizes production of noises and allows extraction of correct signals.

FIG. 1 is a schematic view showing construction of an exemplary one of conventional infrared rays detecting apparatus. Referring to FIG. 1, reference numeral 10 denotes a vacuum insulated vessel which is carried on a helium circulating cooler 12. The vacuum insulated vessel 10 includes an outer tube 14 made of Kovar and an inner tube 16 made of glass. The outer and inner tubes 14 and 16 are both mounted on a mounting member 18 made of Kovar, and the mounting member 18 is secured to a support member 20 mounted on the helium circulating cooler 12. Reference numeral 22 denotes an annular ceramic substrate for extracting leads from the vacuum insulated vessel 10 to the outside, and the annular ceramic substrate 22 is mounted in a sandwiched condition on the outer tube 14. Meanwhile, an infrared rays sensor 24 of the multi-element type made of HgCdTe or the like is adhered to an upper end face of the inner tube 16. Further, a germanium window 14a for introducing infrared rays therethrough is provided at a top portion of the outer tube 14.

Referring now to FIG. 2, there is shown a partly omitted perspective view of the infrared rays detecting apparatus of FIG. 1 but with the outer tube 14 removed, and particularly a wiring condition from the infrared rays sensor 24 to conductive patterns on the annular ceramic substrate 22 can be seen clearly. As shown in FIG. 2, a grounding line E and first to twelfth element lines L1 to L12 are formed on an upper end face and a side face of the inner tube 16, and a common grounding electrode and a plurality of output electrodes of the infrared rays sensor 24 are connected by bonding gold wires 25 to the grounding line E and element lines L1 to L12. The grounding line E and element lines L1 to L12 are formed by vapor depositing gold to a surface of the inner tube 16 to form a deposited gold film and cutting the deposited gold film with a laser beam, etching or the like to separate them in a predetermined spaced relationship from each other. Meanwhile, a number of metal patterns 22a corresponding to the number of the grounding line E and element lines L1 to L12 are vapor deposited on the annular ceramic substrate 22, and the gold patterns 22a and the grounding line E and element lines L1 to L12 are individually connected to each other by bonding gold wires 27.

With the construction described above, when the helium circulating cooler 12 operates, the infrared rays sensor 24 is cooled substantially to the temperature of liquid nitrogen by way of a rod 26 made of stainless steel and a heat conducting spring 28 made of a copper alloy to detect infrared rays.

By the way, on the inner tube 16 of the conventional infrared rays detecting apparatus shown in FIG. 2, loops are formed by the element lines L1 to L12 and the grounding line E. Where a loop is formed, for example, by the sixth element line L6 and the grounding line E, such a loop R as shown in FIG. 3 is formed.

In a condition wherein the loop R is formed in this manner, if, for example, the infrared rays detecting apparatus is vibrated or an external magnetic field is fluctuated, such an electromotive force V as defined by an expression (1) given below is produced in the loop R. Since the electromotive force V increases in proportion to a loop area S as can be seen from the expression (1), where the loop area is great, the electromotive force V is high accordingly, which will make a noise source. Accordingly, it is a problem that correct detection cannot be accomplished.

$$V = -B(dS/dt) \tag{1}$$

In the expression (1), B is a magnetic flux density [wb/m$^2$], and S is a loop area [m$^2$] of the loop R.

SUMMARY OF THE INVENTION

Accordingly, it is an object of the present invention to provide an infrared rays detecting apparatus which, overcoming such problems of the conventional infrared rays detecting apparatus as described above, minimizes production of noises arising from an area of a loop formed by an element line and a grounding line and can effect correct detection.

In accordance with an aspect of the present invention, there is provided an infrared rays detecting apparatus which comprises an outer tube having an infrared rays transmitting window; an inner tube accommodated in the outer tube; an infrared rays sensor of the multielement type carried on the inner tube and having a common grounding electrode and a number of output electrodes corresponding to the number of the elements thereof; a plurality of element lines formed on the inner tube and each connected to a corresponding one of the output electrodes; a plurality of grounding lines formed on the inner tube and connected commonly to the common grounding electrode, the grounding lines being provided such that each of them is interposed between an arbitrary number of ones of the element lines and another arbitrary number of ones of the element lines; low temperature cooling means for cooling the multielement element type infrared rays sensor to a low temperature; and means for extracting signals from the element lines and grounding lines to the outside of the outer tube.

Since patterns wherein a grounding line is interposed for each arbitrary number of element lines are formed on the surface of the inner tube of the infrared rays detecting apparatus, a loop which is formed by an element line and a grounding line can be reduced in size, and as a result, the loop area can be reduced. Accordingly, the electromotive force which is produced when, for example, the infrared rays detecting apparatus is vibrated or an external magnetic field is fluctuated is reduced, and consequently, production of induction noises arising from such electromotive force can be reduced. As a result, correct signals can be extracted from the infrared rays detecting apparatus.

The above and other objects, features and advantages of the present invention and the manner of realizing them will become more apparent, and the invention itself will best be understood, from a study of the following description and appended claims with reference had to the attached drawings showing some preferred embodiments of the invention.

DESCRIPTION OF THE PREFERRED EMBODIMENT

Figure 1:
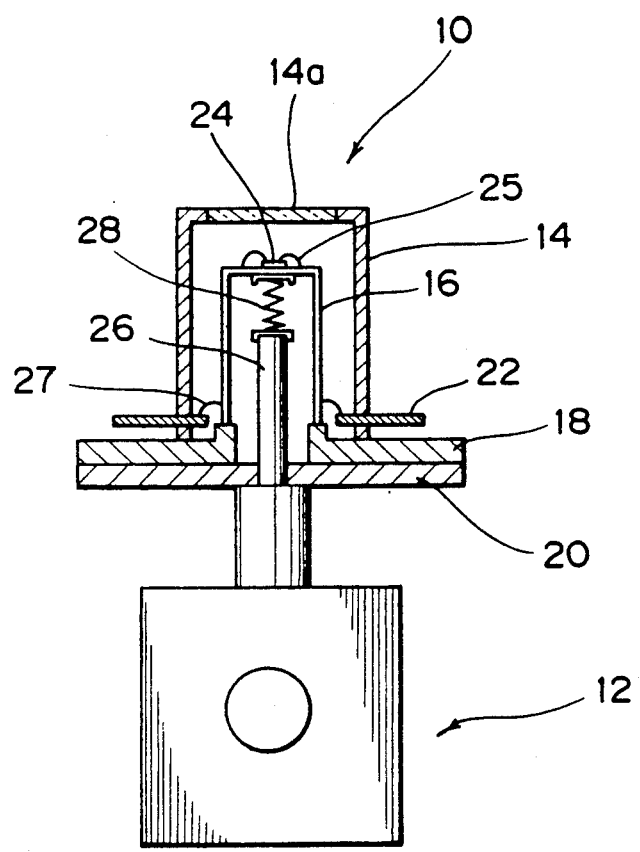
FIG. 1 is a schematic sectional view of a conventional infrared rays detecting apparatus.
Figure 2:
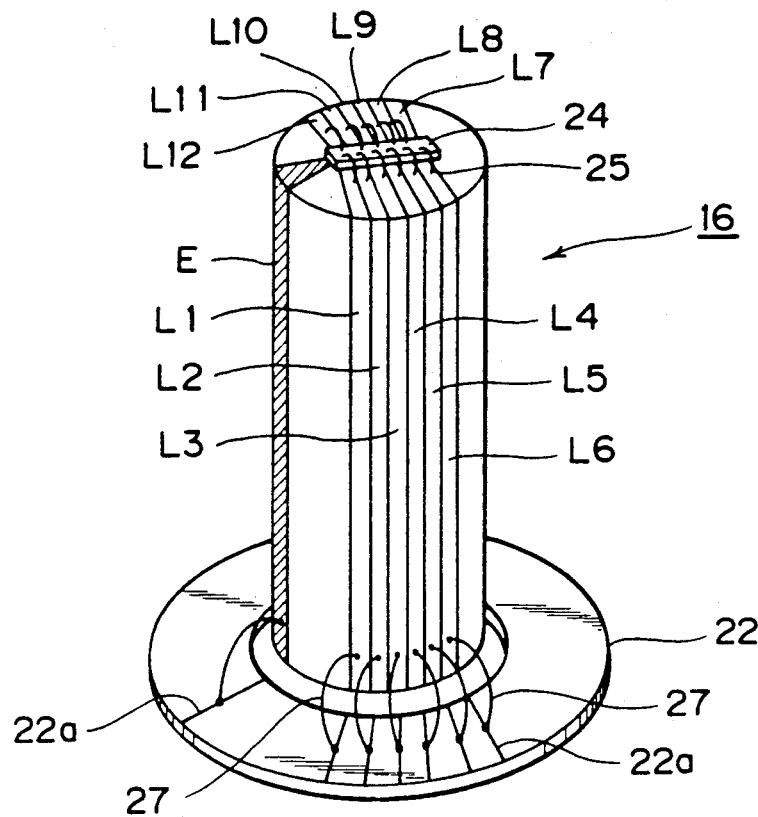
FIG. 2 is a perspective view, partly omitted, of the infrared rays detecting apparatus shown in FIG. 1 but with an outer tube removed.
Figure 4:
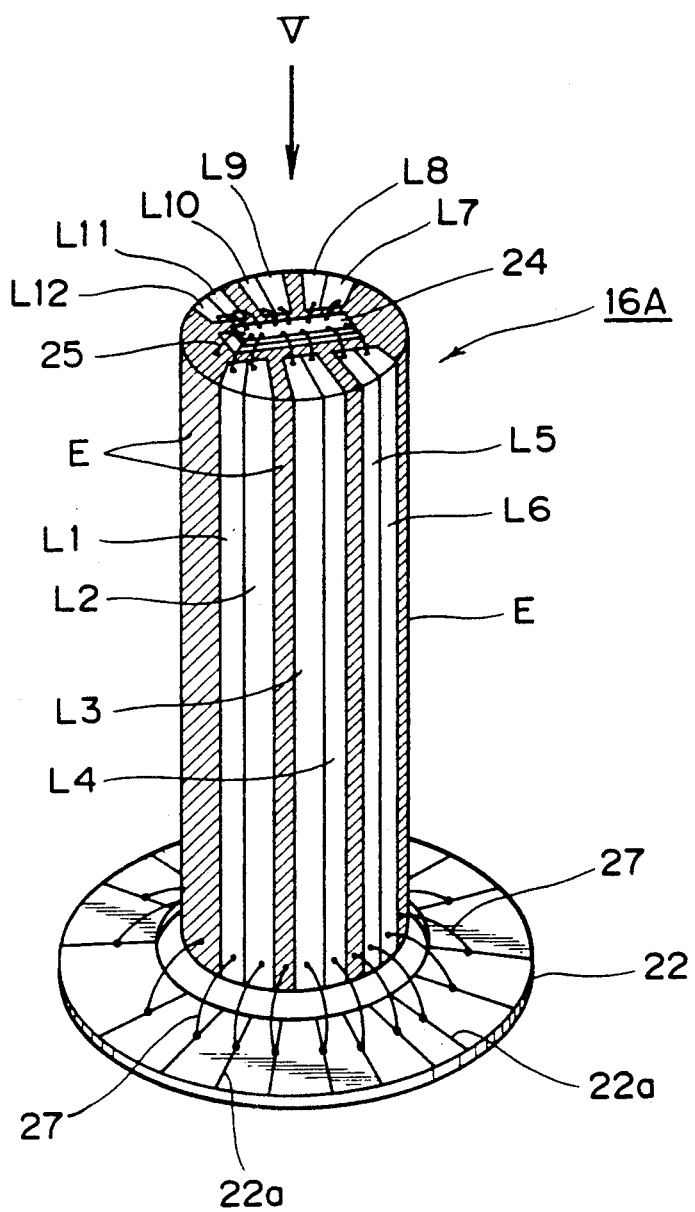
FIG. 4 is a perspective view showing construction of an inner tube of an infrared rays detecting apparatus according to an embodiment of the present invention.
Figure 5:
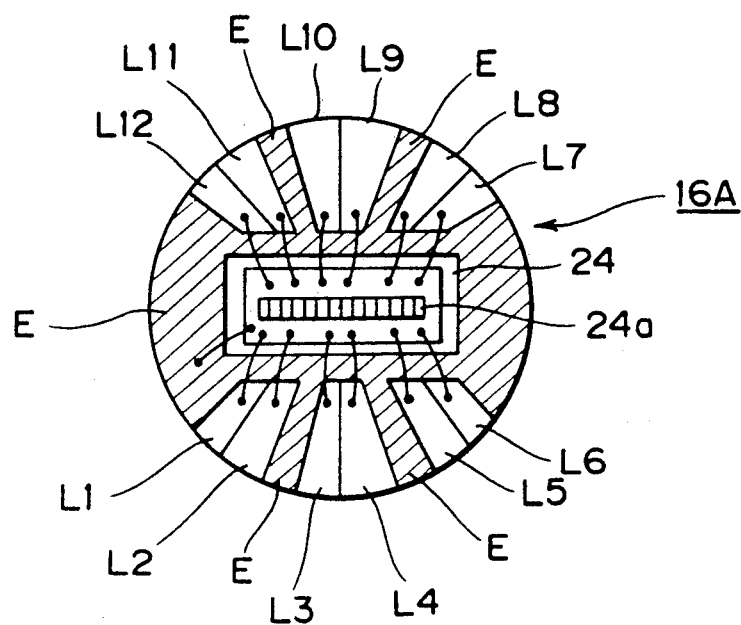
FIG. 5 is a view as viewed in the direction indicated by an arrow mark V in FIG. 4.

In the following, an embodiment of the present invention will be described with reference to the drawings. FIG. 4 is a perspective view showing construction of an inner tube 16A of an infrared rays detecting apparatus according to an embodiment of the present invention, and FIG. 5 is a plan view of the inner tube 16A shown in FIG. 4 but as viewed in the direction indicated by an arrow mark V. It is to be noted that like or corresponding elements or portions to those of the conventional infrared rays detecting apparatus shown in FIG. 2 are denoted by like reference numerals or characters in FIGS. 4 and 5.

Referring first to FIG. 4, reference numeral 24 denotes an infrared rays sensor adhered to a central portion of an upper face of the inner tube 16A, and the infrared rays sensor 24 is made of HgCdTe. A light receiving portion 24a for detecting infrared rays is exposed on an upper face of the infrared rays sensor 24 as seen in FIG. 5, and a plurality of output electrodes and a common grounding electrode for extracting signals therethrough are exposed around the light receiving portion 24a. Reference character E denotes a grounding line and reference characters L1 to L12 denote first to twelfth element lines, respectively. The grounding lines E and element lines L1 to L12 are formed by vapor depositing gold on a surface of the inner tube 16A to form a deposited gold film and cutting the deposited gold film with a laser beam, etching or the like into individually predetermined patterns. The patterns are arranged such that a grounding line E is interposed for each two element lines. In particular, a grounding line E is interposed between the first and second element lines L1 and L2 and the third and fourth element lines L3 and L4, and similarly, another grounding line E is interposed between the third and fourth element lines L3 and L4 and the fifth and sixth element lines L5 and L6; and a last grounding line E is interposed between the eleventh and twelfth element lines L11 and L12 and the first and second element lines L1 and L2. All of the grounding lines E are connected to one another on the upper face of the inner tube 16A as shown in FIG. 5.

The grounding lines E and element lines L1 to L12 are connected to the common grounding electrode and output electrodes of the infrared rays sensor 24 by bonding gold wires 25. Meanwhile, reference numeral 22 denotes an annular ceramic substrate disposed around the inner tube 16A and a number of gold patterns 22a corresponding to the number of patterned grounding lines E and element lines L1 to L12 formed on an outer peripheral face of the inner tube 16A are vapor deposited. The gold patterns 22a are individually bonded to the grounding lines E and element lines L1 to L12 by way of gold wires 27.

Figure 3:
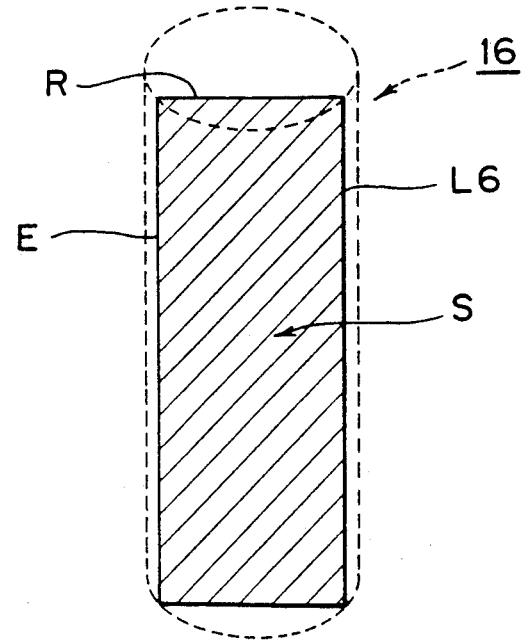
FIG. 3 is an illustration showing a loop R provided by an element line and a grounding line formed on an inner tube and a loop area S of the loop R.
Figure 6:
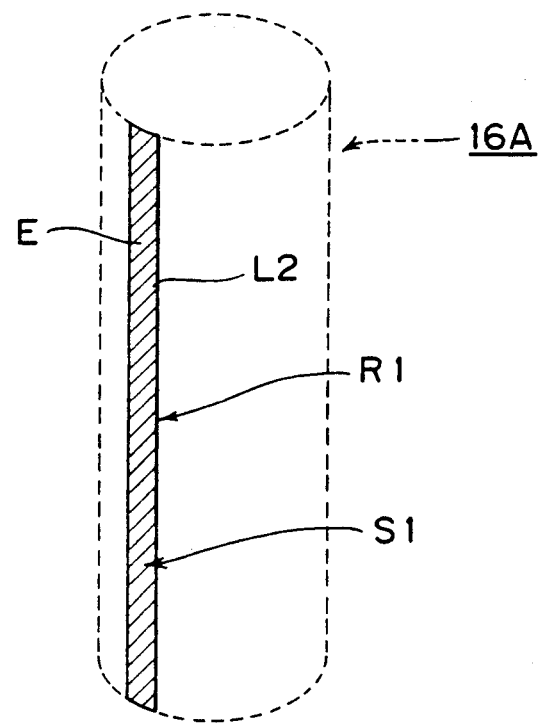
FIG. 6 is an illustration showing a loop R1 provided by an element line and a grounding line formed on an inner tube and a loop area S1 of the loop R1.

According to the construction described above, since a grounding line E is interposed for each two element lines, loops R1 provided by the individual element lines L1 to L12 and the grounding lines E have such a uniform width corresponding to two elements lines as shown in FIG. 6. Accordingly, the loop area S1 of the loop R is significantly smaller than the loop area S of the loop R shown in FIG. 3. Consequently, the electromotive force produced in the loop when, for example, the infrared rays detecting apparatus is vibrated or an external magnetic field is fluctuated is decreased, and accordingly, induction noises arising from such electromotive force is reduced.

Further, while a grounding line is interposed for each two element lines in the embodiment described above, the loop area may be decreased otherwise by interposing a grounding line for each element line or by interposing grounding lines irregularly like one element line - one grounding line - three element lines - one grounding line - two element lines - ...

Figure 7:
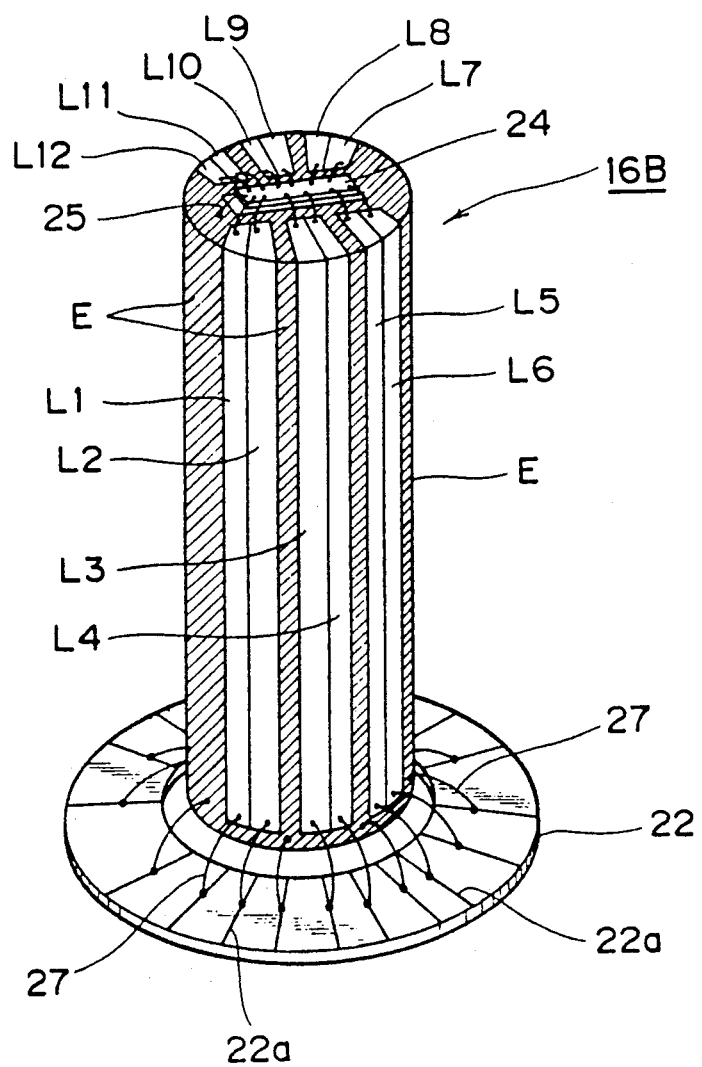
FIG. 7 is a view similar to FIG. 4 but showing another embodiment of inner tube.

As shown in FIG. 7, the grounding lines E may be connected to each other at a bottom portion of an inner tube 16B. Where the grounding lines are connected to each other at the top portion and the bottom portion of the inner tube, a loop which may otherwise be formed from the gold patterns 22a on the annular ceramic substrate 22 can be eliminated.

As described so far, according to the present invention, since, in an infrared rays detecting apparatus having a tube on which an infrared rays sensor of the multi-element type having a common grounding electrode and a plurality of output electrodes is carried and on a surface of which grounding lines and a plurality of element lines for the connection of the grounding electrode and the plurality of output electrodes of the multi-element type infrared rays sensor are formed, patterns are formed on the surface of the tube such that a grounding line is interposed for each arbitrary number of electrode lines, a loop provided by an element line and a grounding line can be reduced in size, and consequently, the loop area can be reduced.

Accordingly, since the electromotive force which is produced in such loop when, for example, the infrared rays detecting apparatus is vibrated or an external magnetic field is fluctuated is reduced, production of noises arising from such electromotive force can be reduced, and accordingly, correct infrared rays detection can be accomplished.

What is claimed is:

1. An infrared rays detecting apparatus, comprising:
    an outer tube having an infrared rays transmitting window;
    an inner tube accommodated in said outer tube;
    an infrared rays sensor of the multi-element type carried on said inner tube and having a common grounding electrode and a number of output electrodes corresponding to the number of the elements thereof;
    a plurality of element lines formed on said inner tube and each connected to a corresponding one of said output electrodes;
    a plurality of grounding lines formed on said inner tube and connected commonly to said common grounding electrode, said grounding lines being provided such that each of them is interposed between an arbitrary number of ones of said element lines and another arbitrary number of ones of said element lines;
    low temperature cooling means for cooling said multi-element type infrared rays sensor to a low temperature; and
    means for extracting signals from said element lines and grounding lines to the outside of said outer tube.

2. An infrared rays detecting apparatus according to claim 1, wherein said multi-element type infrared rays sensor is made of HgCdTe crystal.

3. An infrared rays detecting apparatus according to claim 1, wherein said element lines and grounding lines are made of gold.

4. An infrared rays detecting apparatus according to claim 3, wherein said element lines and grounding lines are formed by laser cutting a deposited gold film formed uniformly by vapor deposition on said inner tube.

5. An infrared rays detecting apparatus according to claim 1, wherein said signal extracting means includes an annular ceramic substrate extending through said outer tube, a plurality of gold patterns formed on said annular ceramic substrate, and a plurality of gold wires for individually connecting said gold patterns to said element lines or grounding lines.

6. An infrared rays detecting apparatus according to claim 1, wherein said grounding lines are connected with each other at a bottom portion of said inner tube.

7. An infrared rays detecting apparatus according to claim 1, wherein said grounding lines are connected with each other at a bottom portion of said inner tube.

8. An infrared rays detecting apparatus according to claim 1, wherein said grounding lines are connected with each other both at a top portion and a bottom portion of said inner tube.

* * * * *